(12) United States Patent
Bojanowski

(10) Patent No.: US 12,407,331 B2
(45) Date of Patent: Sep. 2, 2025

(54) SYSTEMS AND METHODS FOR PROVIDING A TUNABLE RADIO FREQUENCY BANDPASS FILTER WITH VARIABLE CROSS-COUPLING

(71) Applicant: L3Harris Global Communications, Inc., Melbourne, FL (US)

(72) Inventor: Dereck Bojanowski, Fairport, NY (US)

(73) Assignee: L3Harris Global Communications, Inc., Melbourne, FL (US)

( * ) Notice: Subject to any disclaimer, the term of this patent is extended or adjusted under 35 U.S.C. 154(b) by 40 days.

(21) Appl. No.: 18/411,505

(22) Filed: Jan. 12, 2024

(65) Prior Publication Data

US 2025/0233579 A1    Jul. 17, 2025

(51) Int. Cl.
    *H03H 11/04*    (2006.01)
(52) U.S. Cl.
    CPC .................... *H03H 11/04* (2013.01)
(58) Field of Classification Search
    CPC ......................................... H03H 11/04
    See application file for complete search history.

(56) References Cited

U.S. PATENT DOCUMENTS

| | | | |
|---|---|---|---|
| 7,259,643 B2 | 8/2007 | Son et al. | |
| 8,742,870 B2 | 6/2014 | Franzon et al. | |
| 2005/0184828 A1 | 8/2005 | Son et al. | |
| 2006/0109064 A1* | 5/2006 | Toncich | H03H 9/76 |
| | | | 333/195 |
| 2008/0136560 A1 | 6/2008 | Bavisi et al. | |
| 2009/0085818 A1 | 4/2009 | Rohani et al. | |
| 2012/0092074 A1* | 4/2012 | Yanduru | H03F 1/0288 |
| | | | 330/295 |
| 2013/0162374 A1 | 6/2013 | Tamiazzo et al. | |
| 2015/0002240 A1 | 1/2015 | Reiha | |
| 2017/0222614 A1* | 8/2017 | Ellä | H01P 1/20345 |
| 2019/0181834 A1 | 6/2019 | Bauder et al. | |
| 2019/0181835 A1* | 6/2019 | Timme | H04B 1/18 |
| 2020/0014362 A1* | 1/2020 | Zhang | H03H 7/0161 |
| 2023/0199943 A1 | 6/2023 | Tonoe et al. | |

FOREIGN PATENT DOCUMENTS

| | | |
|---|---|---|
| DE | 102014119624 | 9/2015 |
| WO | 2004073165 | 8/2004 |

OTHER PUBLICATIONS

Dufek, "Concept of the Tunable Filter Unit for Agile Mobile Handsets," 2012 Loughborough Antennas & Propagation Conference, Nov. 12 - 13, 2012, Loughborough, UK (4 pages).

Fu et al., "A UHF 3rd Order 5-bit Digital Tunable Bandpass Filter Based on Mixed Coupled Open Ring Resonators," 2016 Progress In Electromagnetic Research Symposium (PIERS), Shanghai, China, Aug. 8-11, (4 pages).

Lin et al., "400-560 MHz Tunable 2-Pole RF MEMS Bandpass Filter With Improved Stopband Rejection," 2018 IEEE/MTT-S International Microwave Symposium, pp. 510-513.

* cited by examiner

*Primary Examiner* — Sibin Chen
(74) *Attorney, Agent, or Firm* — Fox Rothschild LLP; Carol E. Thorstad-Forsyth

(57) ABSTRACT

A bandpass filter comprising: a plurality of shunt resonators connected in series and configured to allow signals within a range of frequencies to pass; and a cross-coupling circuits connected to the plurality of shunt resonators and configured to generate a first transmission zeros in a low rejection band of the bandpass filter and generate a second transmission zero in a high rejection band of the bandpass filter.

19 Claims, 17 Drawing Sheets

SYSTEMS AND METHODS FOR PROVIDING A TUNABLE RADIO FREQUENCY BANDPASS FILTER WITH VARIABLE CROSS-COUPLING

BACKGROUND

Description of the Related Art

Systems may operate in a congested radio frequency (RF) communications environment which can encompass several co-located high power RF communication systems. In response, to ensure robust communications, highly selective co-location RF bandpass filters are required in transmit and receive modes to remove interfering signals and noise. Vehicular RF system installations are space sensitive requiring the need for smaller form factor solutions that also support the higher power handing capabilities of RF power amplifier systems. As new waveform capabilities are being developed, the necessity of co-location filters to have improved tuning speeds and wider bandwidths is significant. With the need for smaller form factors, faster tuning speeds, wider bandwidth support and improved rejection, it becomes evident that a new solution is needed for RF filtering.

SUMMARY

This document concerns a bandpass filter. The bandpass filter comprises: a plurality of shunt resonators coupled in series and configured to allow signals within a range of frequencies to pass; and a cross-coupling circuit connected to the plurality of shunt resonators and configured to generate a first transmission zero in a low rejection band of the bandpass filter and generate a second transmission zero in a high rejection band of the bandpass filter.

This document also concerns a bandpass filter that comprises: a plurality of series coupled shunt resonators and configured to allow signals within a range of frequencies to pass; and first and second cross-coupling circuits connected to the plurality of resonators and collectively configured to generate first and second transmission zeros in a low rejection band of the bandpass filter and generate third and fourth transmission zeros in a high rejection band of the bandpass filter.

The present document also concerns implementing systems and methods for operating a bandpass filter. The methods comprise: performing operations by the bandpass filter to allow signals within a range of frequencies to pass; tuning a first variable capacitance of a first cross-coupling circuit to concurrently adjust a position of a first transmission zero in a low rejection band of the bandpass filter relative to a center frequency of a passband of the bandpass filter and to adjust a position of a second transmission zero in a high rejection band of the bandpass filter relative to the center frequency; and tuning a second variable capacitance of a second cross-coupling circuit to concurrently adjust a position of a third transmission zero in the low rejection band relative to the center frequency and to adjust a position of a fourth transmission zero in the high rejection band relative to the center frequency.

BRIEF DESCRIPTION OF THE DRAWINGS

This disclosure is facilitated by reference to the following drawing figures, in which like numerals represent like items throughout the figures.

FIG. 6 provides an illustrative filter tunable parameter table with decimal representations.

FIG. 7 provides an illustrative filter tunable parameter table with binary representations.

DETAILED DESCRIPTION

Figure 1:
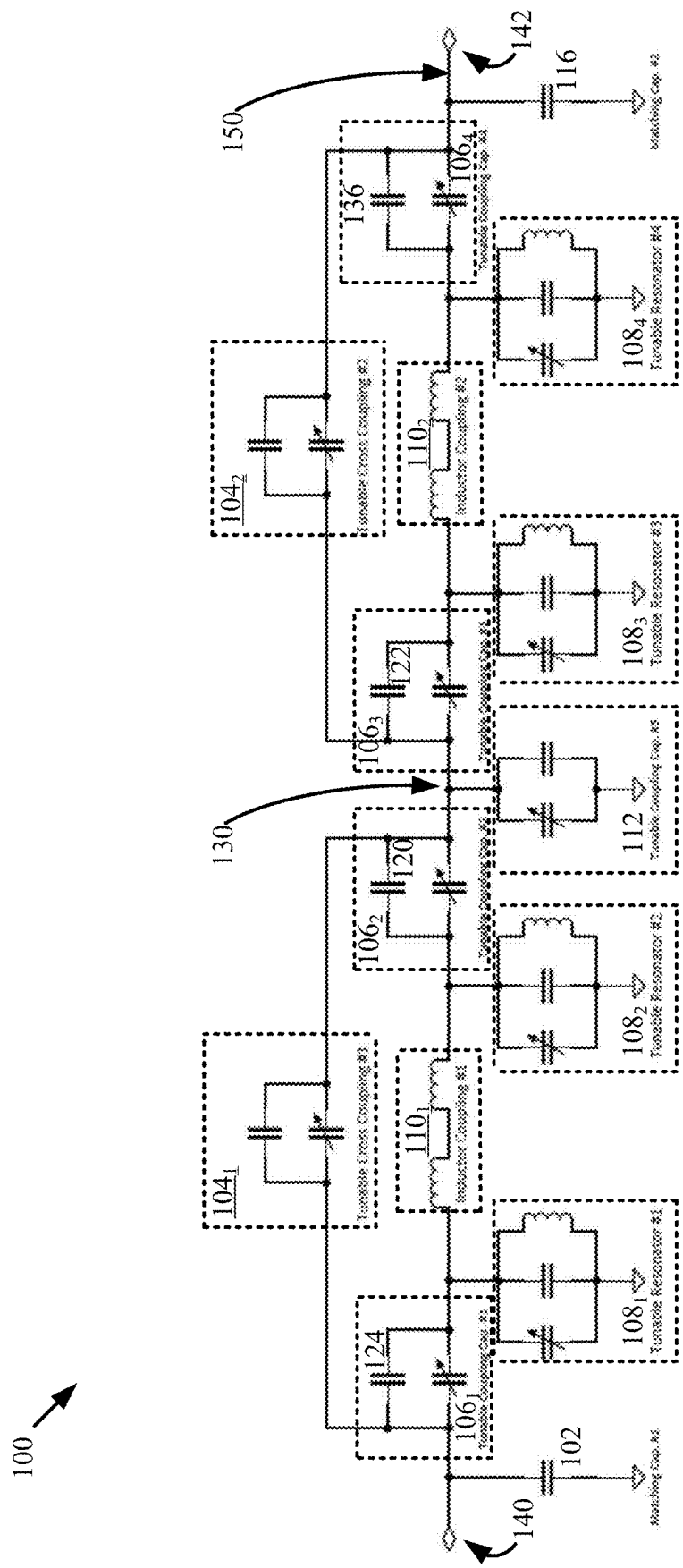
FIG. 1 provides a circuit diagram for a bandpass filter in accordance with the present solution.

It will be readily understood that the solution described herein and illustrated in the appended figures could involve a wide variety of different configurations. Thus, the following more detailed description, as represented in the figures, is not intended to limit the scope of the present disclosure but is merely representative of certain implementations in different scenarios. While the various aspects are presented in the drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Existing co-location filter designs include a PIN diode-based design for very high frequency (VHF) frequencies and a custom filter module design for ultra-high frequency (UHF) frequencies. The PIN diode-based design does provide high power handing and selectivity. However, it takes up a relatively large area on a board, requires manual factory tuning, has a relatively slow tuning speed, a relatively high power consumption, and a relatively high direct current (DC) input voltage. The custom filter module design does take up less area on a board, but has a relatively lower power handling, less selectivity, slower tuning speed, higher power consumption, and higher cost. The custom filter module design also has a high DC input voltage. To summarize, these filter designs are relatively large, do not support high power handling in ultra-high frequency (UHF), do not support faster tuning speeds or bandwidths for newer waveforms, and are limited in filter selectivity. Thus, there is a need for a new solution for RF filtering. The new solution should be configured to be highly frequency selective and able to handle relatively high power.

The present solution provides a tunable RF bandpass filter with variable cross-coupling. The present solution allows products to have industry leading tunable co-location filter performance in a small and cost-effective form factor. The present solution anticipates a need for improved selectivity and agile co-location filter performance with faster tuning speeds for faster hopping waveforms. Enabling this level of performance provides products with filtering functions which current filters are unable to achieve.

The present solution can be used in a variety of applications. Such applications include, but are not limited to, power amplifier applications, radio applications and/or RF communication device applications.

FIG. 1 provides a circuit diagram for a tunable bandpass filter 100 in accordance with the present solution. The tunable bandpass filter 100 is generally configured to pass a specific bandwidth. The bandwidth can include, but is not limited to, 30-90 MHz (VHF), 90-220 MHz (UHF band 1), or 220-550 MHz (UHF band 2). Bandpass filter 100 solves the complex co-location filter problem through the utilization of tunable capacitors in a unique tunable filter configuration. Bandpass filter 100 comprises four shunt resonators $108_1$, $108_2$, $108_3$, $108_4$ with both inductive resonator coupling elements $110_1$, $110_2$ and capacitive resonator coupling elements $106_1$, $106_2$, $106_3$, $106_4$, 112. Additionally, two filter cross-coupling circuits $104_1$, $104_2$ are employed to generate four stop band transmission zero in the rejection band of the filter, which provides an improved filter selectivity. Each of these components $106_1$, $106_2$, $106_3$, $106_4$, $108_1$, $108_2$, $108_3$, $108_4$, $104_1$, $104_2$, 112 includes a tunable capacitor. As such, all the main filter elements are tunable. The tunability of all the main filter elements, in particular the cross-coupling and series coupling elements, allows for the filter to maintain a consistent shape factor, bandwidth, and selectivity across a wide filter center frequency tuning range.

Figure 2A:
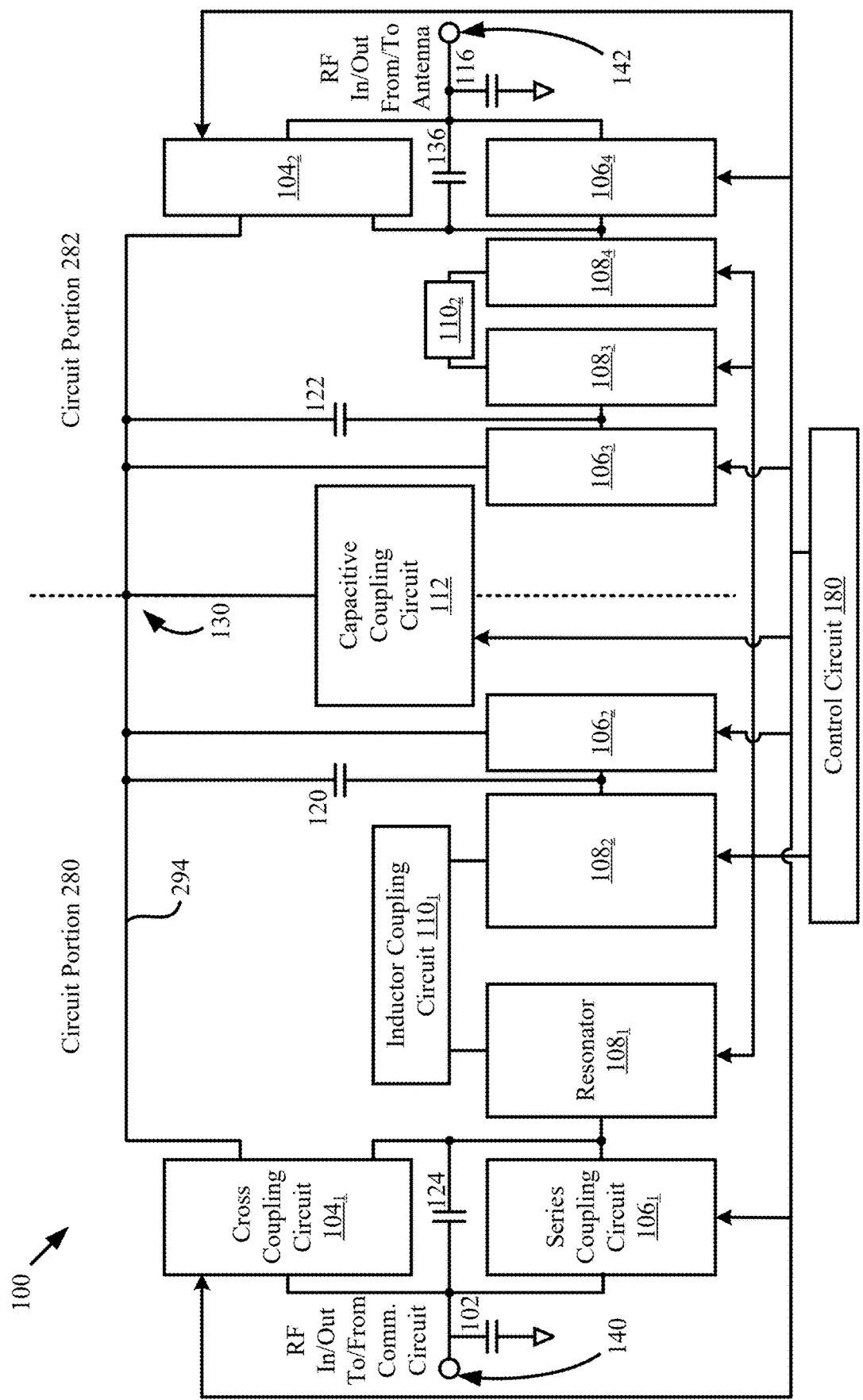
FIGS. 2A-2C (collectively referred to as "FIG. 2") provide more detailed illustrations for the bandpass filter of FIG. 1.
Figure 2B:
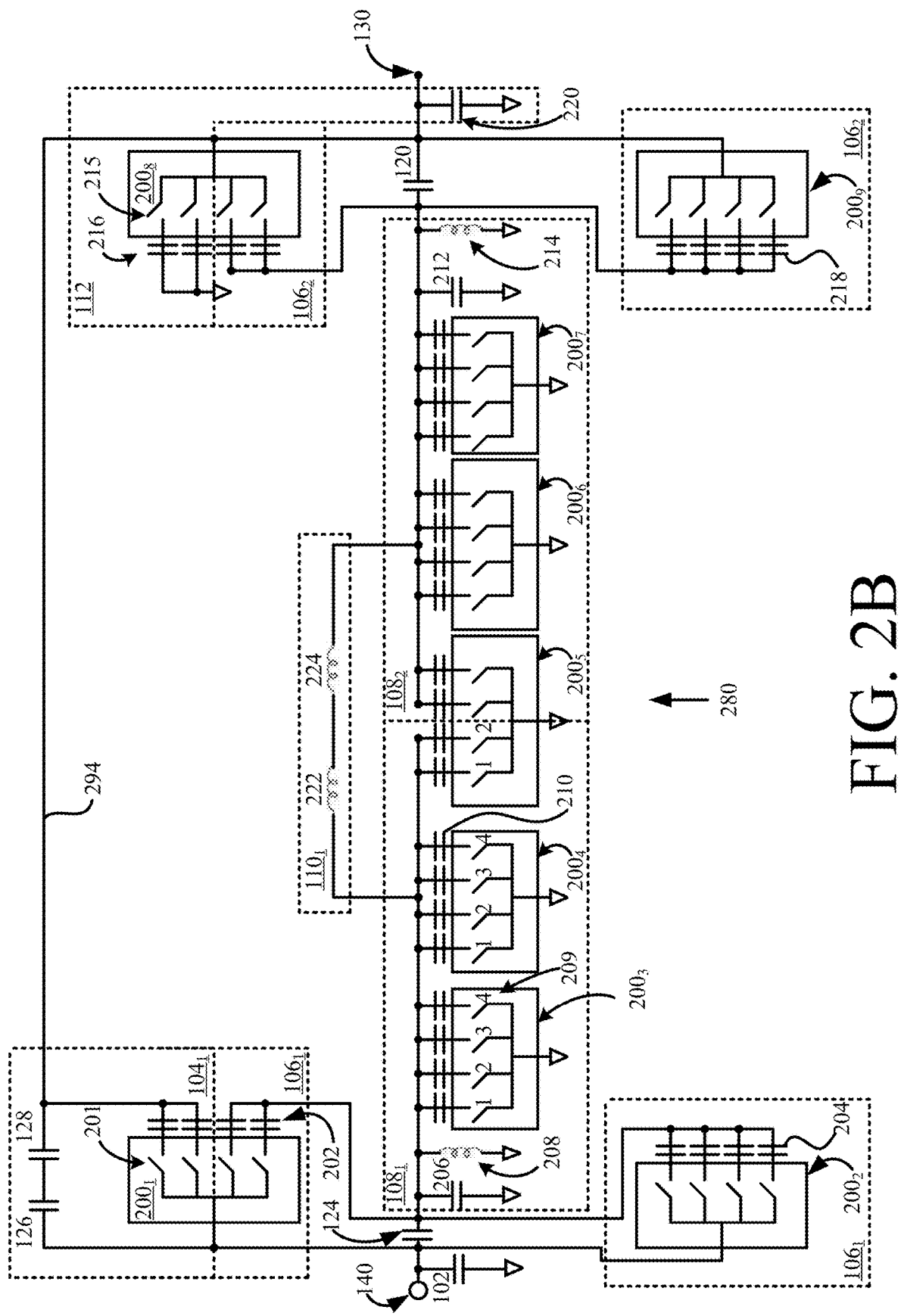
Figure 2C:
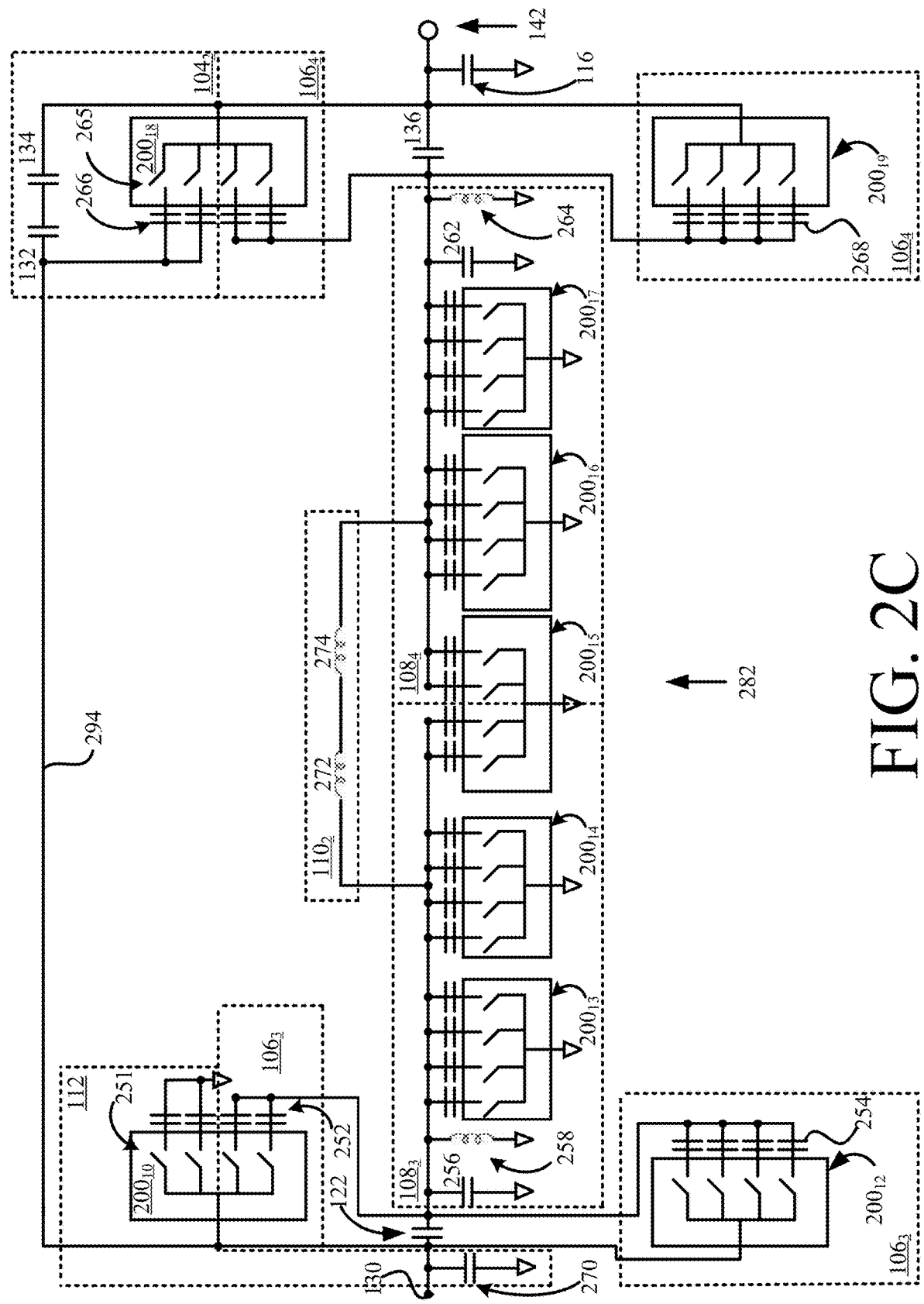

FIG. 2 provide illustrations of an architecture implementing bandpass filter 100. Specifically, FIG. 2A provides a high-level block diagram of the bandpass filter 100, and FIGS. 2B-2C collectively provide a more detailed circuit diagram of the bandpass filter 100. As noted above and shown in FIG. 2A, bandpass filter 100 comprises: four shunt resonators $108_1$, $108_2$, $108_3$, $108_4$, inductive coupling elements $110_1$, $110_2$ and capacitive coupling elements $106_1$, $106_2$, $106_3$, $106_4$, 112 to allow signals within a range of frequencies to pass; and two filter cross-coupling circuits $104_1$, $104_2$ to generate four stop band transmission zero in the rejection band of the filter. Each of these components $106_1$, $106_2$, $106_3$, $106_4$, $108_1$, $108_2$, $108_3$, $108_4$, $104_1$, $104_2$, 112 of the filter include a tunable or variable capacitance. GaN switches are used for tuning the variable capacitances. This allows for higher power handling capability of the bandpass filter. The control of the GaN switches uses a combination of flash memory, field programmable gate arrays (FPGAs), and a shift register structure allowing for faster tuning speeds to be achieved.

Figure 4:
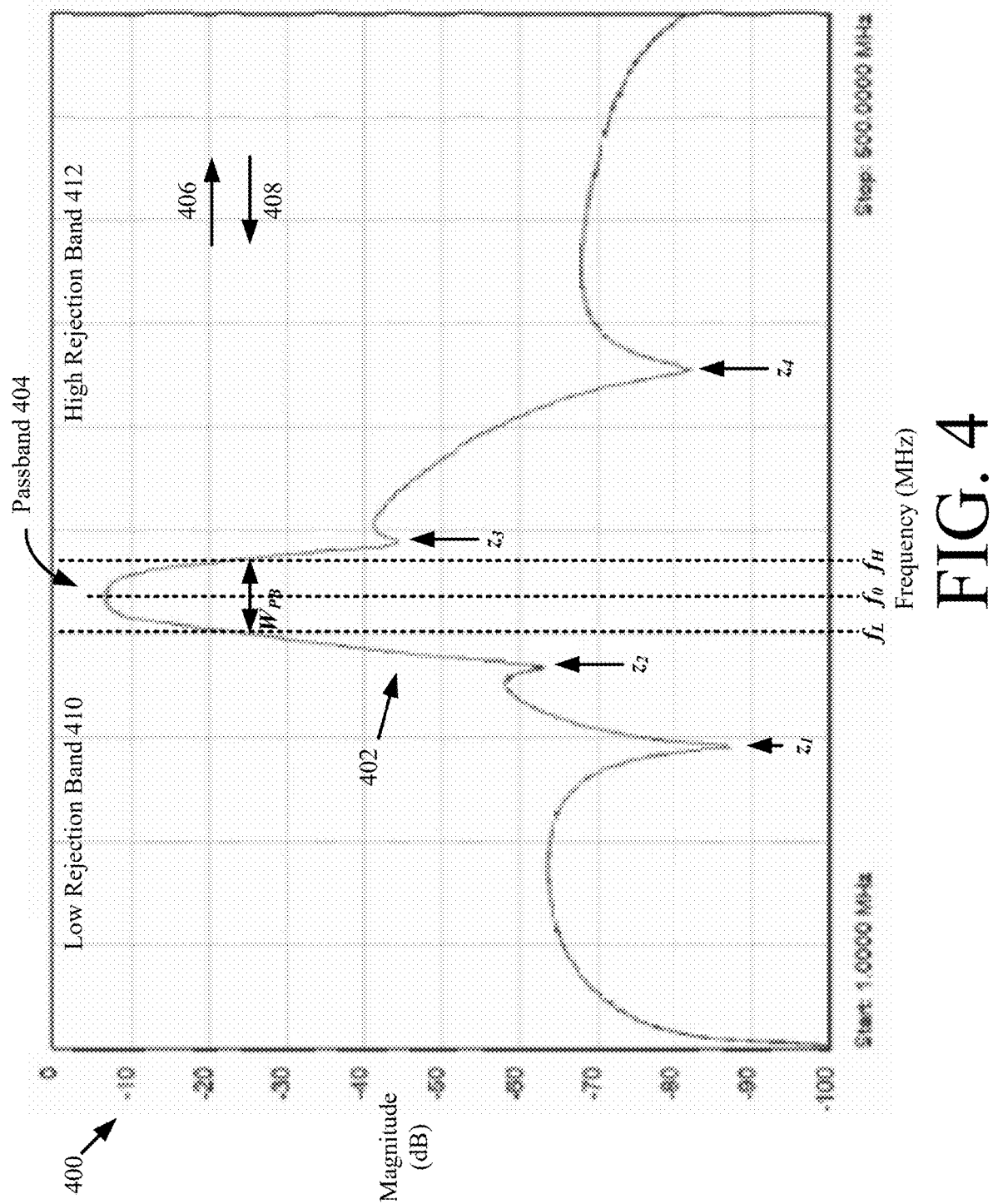
FIG. 4 provides a graph plotting a magnitude transfer function versus frequency for the bandpass filter of FIG. 2.

A graph 400 is provided in FIG. 4 which plots a magnitude transfer function versus frequency for the bandpass filter 100. The graph 400 includes a response waveform 402 showing a passband 404, a low rejection band 410 and a high rejection band 412 of the filter. The passband 404 has a center frequency $f_0$ and is defined by a low frequency $f_L$ and a high frequency $f_H$. Bandpass filter 100 is configured to pass frequencies within range $f_L$-$f_H$ and reject (attenuate) frequencies outside that range. The center frequency and/or range may be set in accordance with a user selected frequency setting of a communication device in which the bandpass filter 100 is implemented. The width $W_{PB}$ of the passband 404 is adjustable. The locations of the transmission zeros $z_1$, $z_2$, $z_3$, $z_4$ within the graph 400 relative to the center frequency $f_0$ are also adjustable. The manner in which these adjustments are made will become evident as the discussion progresses.

Referring back to FIG. 2, the four resonators $108_1$, $108_2$, $108_3$, $108_4$ (collectively referred to as "resonators 108") are coupled together via coupling circuits $106_1$, $106_2$, $106_3$, $106_4$, $110_1$, $110_2$. Components $106_1$, $106_2$, $106_3$, $106_4$ are collectively referred to herein as series coupling circuits 106, and components $110_1$, $110_2$ are collectively referred to as inductor resonator coupling circuits 110. The resonators 108 comprise digitally tunable shunt capacitor resonators. Each of the components 106 and 108 comprises a plurality of capacitors that can be selectively switched into the circuit and switched out of the circuit via control signals from a control circuit 180 (which will be discussed in detail below). The resonators 108 are used to (i) pass waves at specific frequencies within the bandwidth for RF output signals (e.g., transmit Tx signals) and/or (ii) select specific frequencies from each RF input signal (e.g., receive Rx signals).

Figure 5:
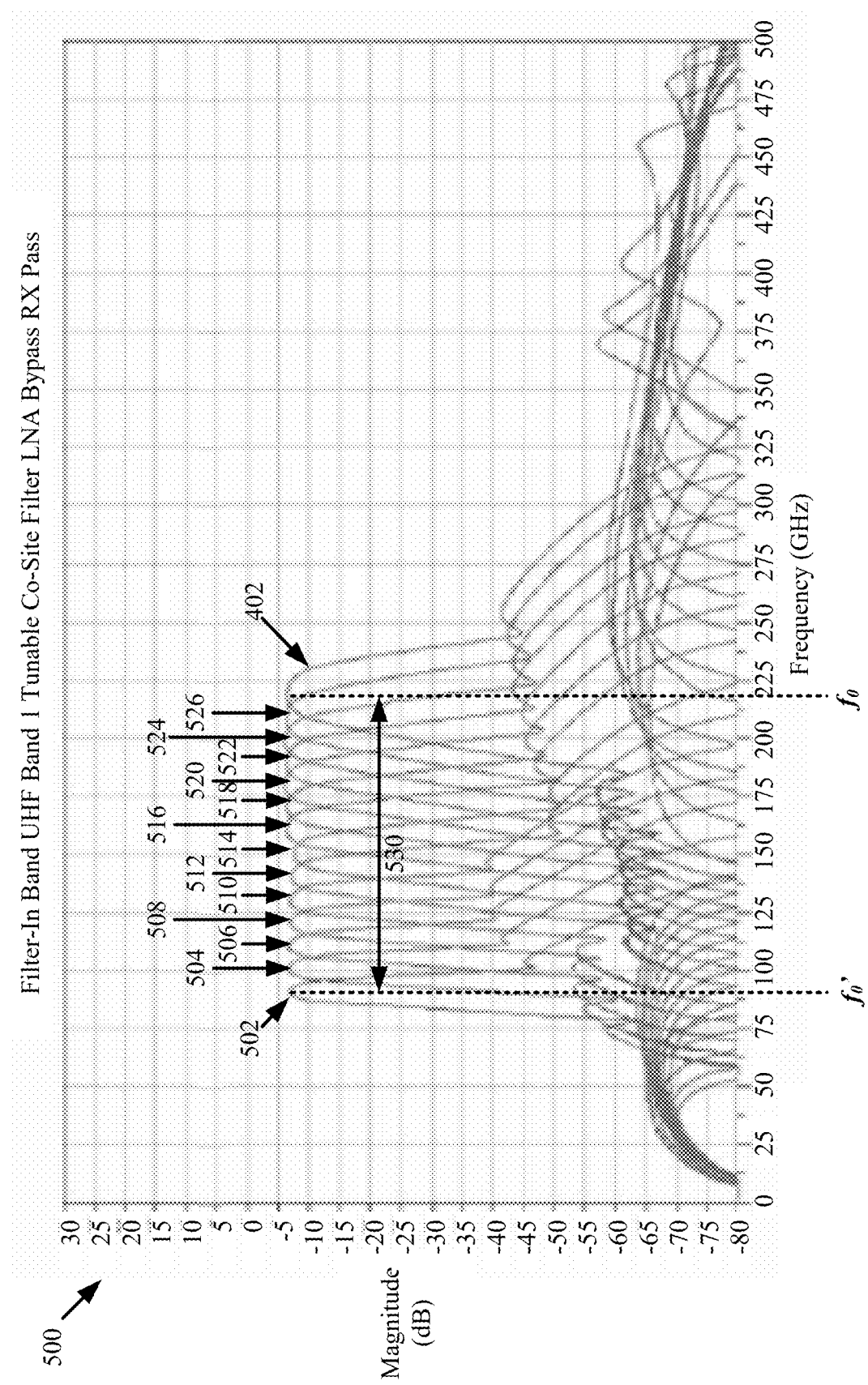
FIG. 5 provides a graph plotting magnitude transfer functions versus frequency for the bandpass filter of FIG. 2.

With regard to operation (i), reference is made to the graph 500 of FIG. 5 which shows plots of magnitude transfer functions versus frequency for the bandpass filter 100. During operation, a user can select a frequency setting from a plurality of different frequency settings. Each waveform 402, 502-526 is associated with a respective one of the different frequency settings. For example, waveform 502 is associated with a lowest frequency setting and waveform 402 is associated with the highest frequency setting. Waveforms 504-526 are associated with intermediary frequency settings. The present solution is not limited to the particulars of this example.

The resonators 108 are arranged in two pairs 280, 282 with one pair 280 residing on one side of the center point 130 and the other pair 282 residing on the opposite side of the center point 130. The center point 130 is a point on the filter line 150 between the resonator pairs 280, 282. The filter line 150 extends between ports 140, 142 of the filter 100. Each resonator pair 280, 282 comprises two resonators $108_1$, $108_2$ or $108_3$, $108_4$ coupled together via the inductor coupling circuit $110_1$ or $110_2$. Each inductor coupling circuit $110_1$, $110_2$ comprises two inductors 222, 224 or 272, 274 coupled between the shunt resonators of the respective pair. The inductors are provided to ensure that the resonators tune to a center frequency point and shift with each other to obtain a particular shape of the filter's response waveform. The tuning of the center frequency is achieved by controlling GaN tuning devices $200_3$, $200_4$, $200_5$, $200_6$, $200_7$ of resonator pair 280 and GaN tuning devices $200_{13}$, $200_{14}$, $200_{15}$, $200_{16}$, $200_{17}$ of resonator pair 282. Each GaN tuning device $200_3$-$200_{17}$ comprises four switches 209 respectively connected to four capacitors 210. Each switch 209 is opened and closed in accordance with the value of a control bit received from the control circuit. For example, a switch 209 is transitioned to an open condition when a control bit has a value of "0", and is transitioned to a closed condition when the control bit has a value of "1". The present solution is not limited in this regard. Each resonator provides a 10-bit tunable shunt capacitor resonator. A tunable series coupling capacitor 106 controls a stable passband across the tunable frequency range of the filter. The tuning range 530 is defined by the capacitance tuning of elements 108 and the coupling in that range from elements 106.

Each resonator also comprises an additional capacitor 206, 212, 256, 262 and an inductor 208, 214, 258, 264. The capacitor and inductor pair of each resonator resonates at a resonant frequency. The capacitor defines the highest frequency of the band to which the resonator can be tuned. The tuning frequency can be shifted down from this highest value by switching in the resonator capacitors. The more resonator capacitors added to the circuit the greater the decrease in frequency. Capacitors 124, 120, 122, 136 are provided to set the minimum coupling and maximum bandwidth of the filter when tuned to the highest frequency of the band. The coupling of the filter can be shifted up from this lowest value by switching in the series coupling capacitors. This helps ensure that a good insertion loss and bandwidth are provided at the highest and lowest tuning frequency.

The capacitive coupling circuit 112 provides a means to adjust the width of the passband portion of the filter's response waveform and couple filter halves 280 and 282. For example, with reference to FIG. 4, capacitive coupling circuit 112 can be controlled to adjust width $W_{PB}$ of the passband portion 404 of the response waveform 402. This control is facilitated by the use of GaN tuning devices $200_8$, $200_{10}$ to selectively switch capacitors into and out of the circuit.

Each GaN tuning device $200_8$, $200_{10}$ comprises four switches 215 or 251 respectively connected to four capacitors in a set 216 or 252. Two of the four capacitors in each set 216 or 252 are connected to ground, while the other two capacitors are connected to the resonator pair 280 or 282 for facilitating a series coupling between resonators $108_2$ and $108_3$ by series coupling circuits $106_2$, $106_3$. The four ground connected capacitors are switched into and out of the circuit for adjusting width $W_{PB}$ and adjusting the coupling between resonators $108_2$ and $108_3$. Each switch is opened in accordance with the value of a control bit received from the control circuit 180. For example, each switch 215, 251 is transitioned to an open condition when a control bit has a value of "0", and is transitioned to a closed condition when the control bit has a value of "1". The present solution is not limited in this regard.

If the bandpass filter is tuned to a single frequency, then the width $W_{PB}$ would be at its narrowest when all four ground connected capacitors are switched into the circuit and is at its widest when all four ground connected capacitors are switched out of the circuit. This switching is achieved by controlling respective switches of the GaN tuning devices $200_8$, $200_{10}$. For example, the ground connected capacitors are switched into the circuit by transitioning the respective switches of the GaN tuning devices $200_8$, $200_{10}$ to their closed condition positions. The ground connected capacitors are switched out of the circuit by transitioning the respective switches of the GaN tuning devices $200_8$, $200_{10}$ into their open condition positions. This tuning feature of the present solution provides a means to ensure that the passband width $W_{PB}$ is wide enough across the tuning frequencies to support waveforms. In all scenarios, the more ground connected capacitors of capacitive coupling circuit 112 that are switched into the circuit the narrower the passband is across frequencies.

The capacitive coupling circuit 112 also comprises capacitors 220 and 270 connected to ground. These capacitors help to define the widest width for the passband in conjunction with inductors 110 and series coupling capacitors 106. The GaN tuning devices $200_8$, $200_{10}$ and capacitors 216, 220, 252, 270 provide a 4-bit digitally tunable shunt coupling capacitor.

The cross-coupling circuits $104_1$, $104_2$ are configured to produce the four transmission zeros in the filter's response waveform (with two on each side of the passband) and provide a means to adjust the locations of the transmission zeros relative to a center frequency of the passband. The adjustment of the four transmission zeros can be performed to achieve high frequency selectivity.

Cross-coupling circuit $104_1$ is connected between a port 140 of the bandpass filter 100 and is also connected to a center point 130 of the circuit. Cross-coupling circuit $104_2$ is connected between a port 142 of the bandpass filter 100 and is also connected to the center point 130. Each port connection to the center point provides two of the four transmission zeros. For example, with reference to FIG. 4, the cross-coupling circuits $104_1$, $104_2$ produce four transmission zeros $z_1$, $z_2$, $z_3$, $z_4$. The two inner-most transmission zeros $z_2$, $z_3$ are linked to each other such that their positions relative to the center frequency $f_0$ are concurrently controlled via cross-coupling circuits $104_1$. Similarly, the two outer-most transmission zeros $z_1$, $z_4$ are linked to each other such that their positions relative to the center frequency $f_0$ are concurrently controlled via cross-coupling circuits $104_2$. The position of each transmission zero can be moved in two opposing directions shown be arrows 406, 408. This feature of the present solution allows a wider bandwidth in the passband without sacrificing insertion loss or rejection. The distance by which the inner most transmission zeros $z_2$, $z_3$ can be moved towards each other may be limited so as to avoid rendering the bandpass filter ineffective or otherwise inoperable. The farthest allowable distance between the two inner-most transmission zeros $z_2$, $z_3$ may be set by capacitors 126, 128. Similarly, the farthest distance between the two outer-most transmission zeros $z_1$, $z_4$ may be set by capacitors 132, 134.

Each cross-coupling circuit $104_1$, $104_2$ comprises a GaN tuning device $200_1$, $200_{18}$. The tuning of the transmission zero positions in a response waveform is achieved by controlling the GaN tuning devices $200_1$, $200_{18}$. Each GaN tuning device $200_1$-$200_{18}$ comprises four switches 201, 265 respectively connected to four capacitors in a set 202 or 266. Two of the four capacitors in each set 202 or 266 are connected to cross-coupling line 294. These capacitors are referred as the cross-coupling capacitors. The other two capacitors are connected to the resonator pair 280 or 282 for facilitating a series coupling between resonators 108 by series coupling circuit $106_1$ or $106_4$. The four cross-coupling capacitors are switched into and out of the circuit for adjusting the transmission zero positions. Each switch 201, 265 is opened and closed in accordance with the value of a control bit received from the control circuit 180. For example, a switch 201 or 265 is transitioned to an open condition when a control bit has a value of "0", and is transitioned to a closed condition when the control bit has a value of "1". The present solution is not limited in this regard.

The inner most transmission zeros $z_2$, $z_3$ are at their closest point to the center frequency $f_0$ when both cross-coupling capacitors are switched into the circuit and are at their farthest point to the center frequency $f_0$ when both cross-coupling capacitors are switched out of the circuit. The inner most transmission zeros $z_2$, $z_3$ are at positions between their closest and farthest points when one of the switches 201 of GaN tuning device $200_1$ is in its closed condition position. This switching is achieved by controlling the respective switches 201 of GaN tuning device $200_1$.

The outer most transmission zeros $z_1$, $z_4$ are at their closest point to the center frequency $f_0$ when both cross-coupling capacitors of GaN tuning device $200_{18}$ are switched into the circuit and are at their farthest point from the center frequency $f_0$ when both cross-coupling capacitors of GaN tuning device $200_{18}$ are switched out of the circuit. The outer most transmission zeros $z_1$, $z_4$ are at positions between their closest and farthest points when one of the cross-coupling capacitors of GaN tuning device $200_{18}$ is switched into the circuit. This switching is achieved by controlling the respective switches 265 of GaN tuning device $200_{18}$.

Bandpass filter 100 also comprises capacitors 102, 116 for impedance matching. For example, capacitor 102, 116 may be selected to provide a 50 Ohm input impedance at port 140 and a 50 Ohm output impedance at port 142.

It should be noted that the present solution is not limited to the particular architecture shown in FIG. 2. For example, the tunable components of bandpass filter 100 have the following features: each cross coupling circuit $104_1$, $104_2$ is shown as comprising a 2-bit digitally tunable component; each series coupling circuit $106_1$, $106_2$, $106_3$, $106_4$ is shown as comprising a 6-bit digitally tunable component; each resonator $108_1$, $108_2$, $108_3$, $108_4$ is shown as comprising a 10-bit digitally tunable component; and the capacitive coupling circuit 112 is shown as comprising a 4-bit digitally tunable component. The total number of bits for digital tuning of each tunable component in filter 100 can be selected in accordance with any given application. The decrease of bits for digital tuning the cross coupling circuits $104_1$, $104_2$ may result in less filter flexibility and less control of the rejection and bandwidth. The increase of bits for digital tuning the cross coupling circuits $104_1$, $104_2$ may cause increase parasitic in the GaN switches which may limit how well the filter tunes and effect how much loss the filter has. The increase in bits for digitally tuning the resonator $108_1$, $108_2$, $108_3$, $108_4$ may decrease the step-size for the center frequency adjustment (e.g., 0.5 MHz to 0.25 MHz). In contrast, the decrease in bits for digitally tuning the resonator $108_1$, $108_2$, $108_3$, $108_4$ may increase the step-size for the center frequency adjustment (e.g., 0.5 MHz to 5 MHz).

Figure 3:
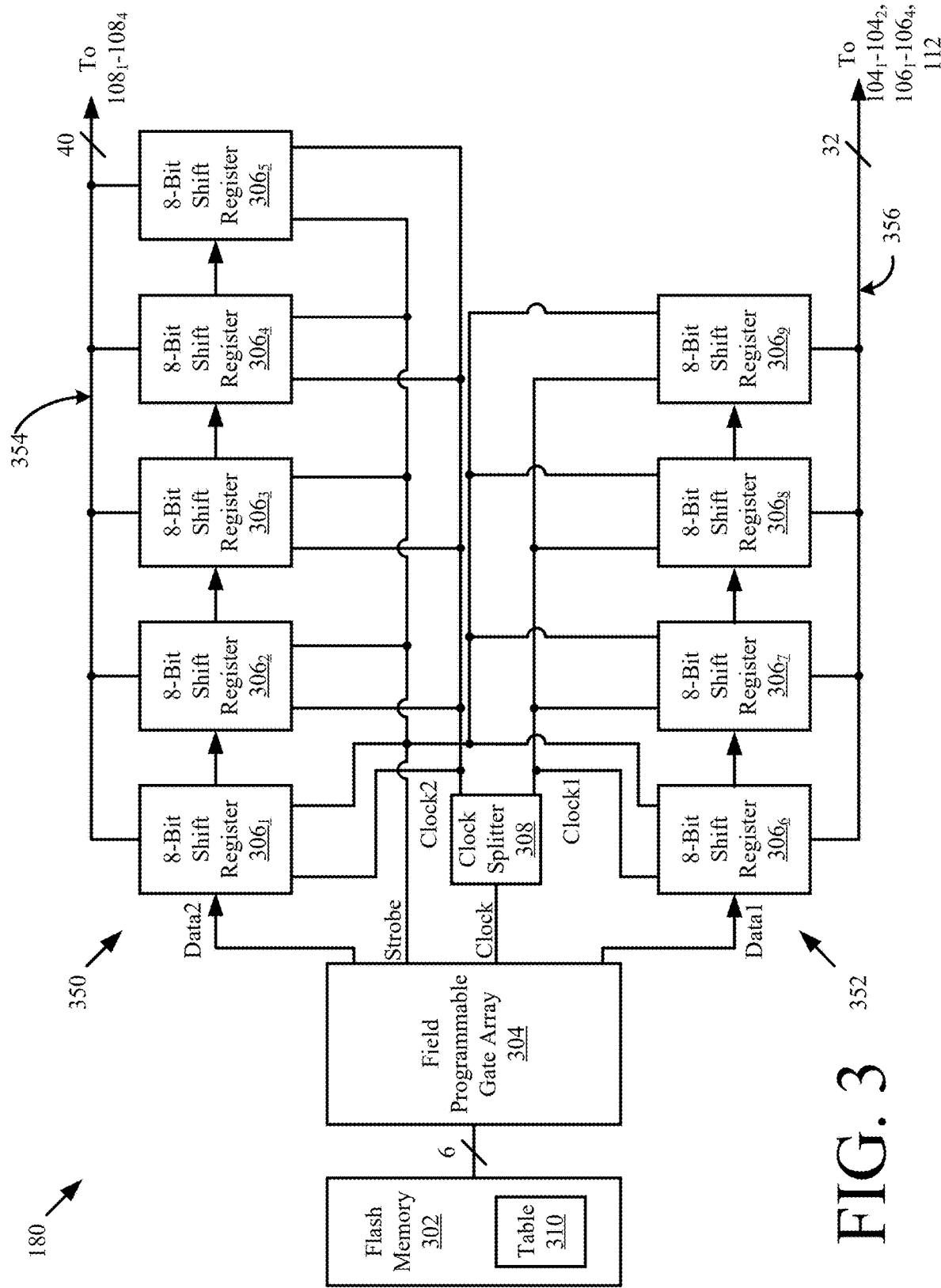
FIG. 3 provides a block diagram of a control circuit for controlling tunable components of the bandpass filter shown in FIG. 2.

FIG. 3 provides a block diagram of the control circuit 180 shown in FIG. 2. Control circuit 180 comprises a flash memory 302, an FPGA 304, a clock splitter 308 and two parallel shift register branches 350, 352. Shift register branch 350 comprises 8-bit shift registers $306_1$, $306_2$, $306_3$, $306_4$, $306_5$, and shift register branch 352 comprises 8-bit shift registers $306_6$, $306_7$, $306_8$, $306_9$. The 8-bit shift registers are collectively referred to herein as shift registers 306. The specific parallel arrangement of the shift register branches allows for a relatively fast tuning speed.

Figures 6, 7:
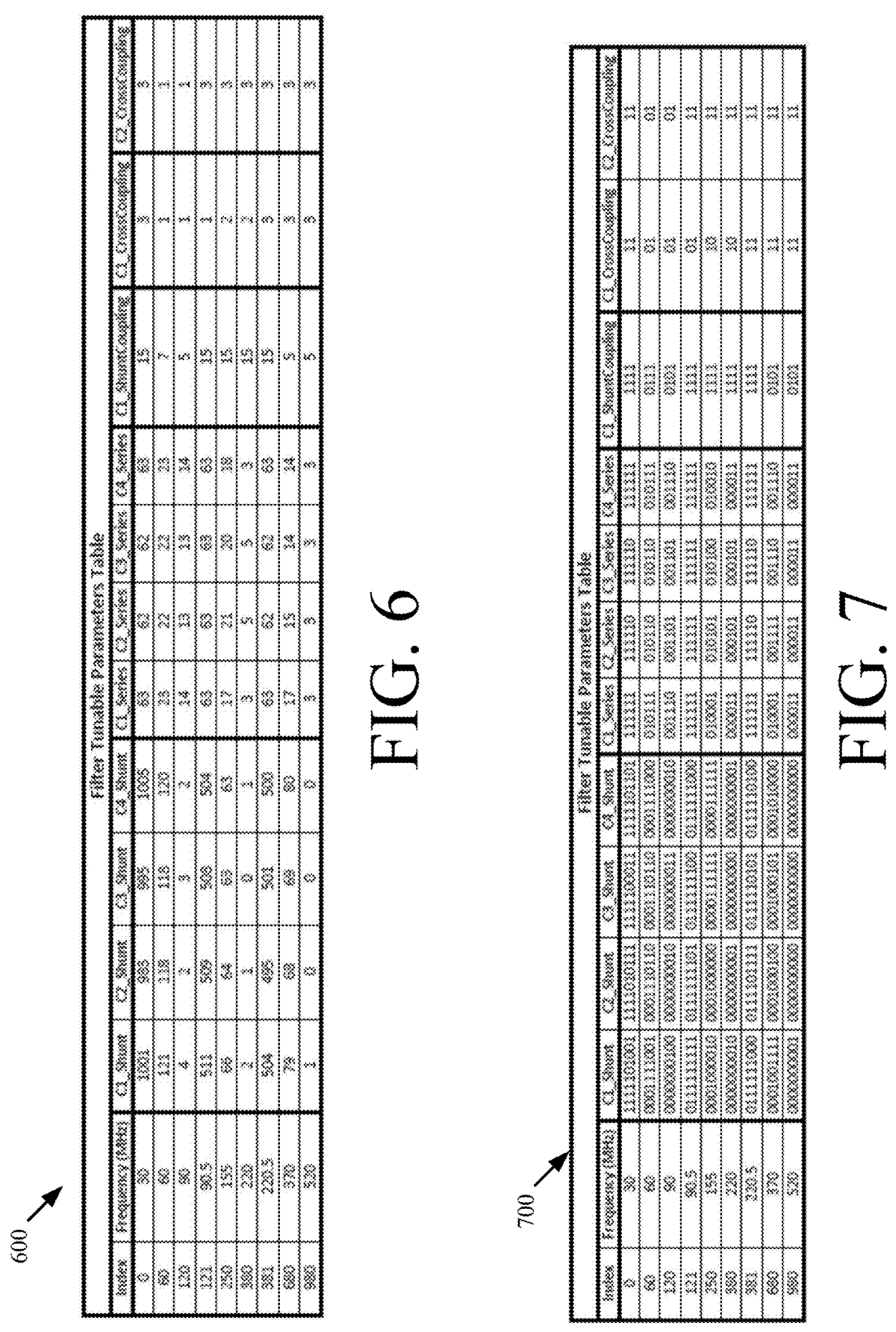

During operation, a user selects a frequency setting from a plurality of possible frequency settings. The FPGA 304 accesses a table 310 stored in the flash memory 302 in response to the user-software interaction. The user-selected frequency setting is used as an index to obtain tune parameter value(s) from table 310 for each one of the tunable circuit components $104_1$, $104_2$, $106_1$, $106_2$, $106_3$, $106_4$, $108_1$, $108_2$, $108_3$, $108_4$, 112. Each tune parameter value may be in a binary representation or a decimal representation. An illustrative filter tunable parameter table 600 with decimal representations of tune parameter values is shown in FIG. 6, and an illustrative filter tunable parameter table 700 with binary representations of tune parameter values is shown in FIG. 7. FPGA 304 may be configured to convert the decimal numbers of FIG. 6 to obtain the binary numbers of FIG. 7. In tables 600 and 700, C1_Shunt refers to resonator $108_1$, C2_Shunt refers to resonator $108_2$, C3_Shunt refers to resonator $108_3$, C4_Shunt refers to resonator $108_4$, C1_Series refers to series coupling circuit $106_1$, C2_Series refers to series coupling circuit $106_2$, C3_Series refers to series coupling circuit $106_3$, C4_Series refers to series coupling circuit $106_4$, C1_ShuntCoupling refers to capacitive coupling circuit 112, C1_CrossCoupling refers to cross coupling circuit $104_1$, and C2_CrossCoupling refers to cross coupling circuit $104_2$.

Once the binary numbers are obtained, FPGA 304 performs operations to generate two streams of zeros and ones, and push a respective stream into the shift registers of each branch 350, 352. The zero and one values are then provided from the shift registers to the respective tunable circuit components via control buses 354, 356. For example, with reference to FIG. 7, the selected tuning frequency is 30 MHz. As such, the following ten bits 1111101001 are provided to C1_Shunt refers to resonator $108_1$ via control bus 354. The following ten bits 1111010111 are provided to C2_Shunt refers to resonator $108_2$ via control bus 354. The following ten bits 1111100011 are provided to C3_Shunt refers to resonator $108_3$ via control bus 354. The following ten bits 1111101101 are provided to C4_Shunt refers to resonator $108_4$ via control bus 354. The following six bits 111111 are provided to series coupling circuit $106_1$ via control bus 356. The following six bits 111110 are provided to series coupling circuit $106_2$ via control bus 356. The following six bits 111110 are provided to series coupling circuit $106_3$ via control bus 356. The following six bits 111111 are provided to series coupling circuit $106_4$ via control bus 356. The following four bits 1111 are provided to capacitive coupling circuit 112 via control bus 356. The following two bits 11 are provided to cross coupling circuit $104_1$ via control bus 356. The following two bits 11 are provided to cross coupling circuit $104_2$ via control bus 356.

As noted above, a one bit value may cause a switch of a GaN tuning device to remain or be transitioned to its closed condition, and a zero bit value may cause a switch of a GaN tuning device to remain or be transitioned to its open condition. For example, ten bit sequence 1111101001 provided to C1_Shunt (i.e., resonator $108_1$) causes switches 1, 2, 3, 4 of GaN tuning device $200_3$ to be maintained or transitioned to their closed positions, switches 1 and 3 of GaN tuning device $200_4$ to be maintained or transitioned to their closed positions, switches 2 and 4 of GaN tuning device $200_4$ to be maintained or transitioned to their open positions, switch 1 of GaN tuning device $200_5$ to be maintained or transitioned to its open position, and switch 2 of GaN tuning device $200_5$ to be maintained or transitioned to its closed position. The present solution is not limited in this regard. Alternatively, a one bit value may cause a switch of a GaN tuning device to remain or be transitioned to its open condition, and a zero bit value may cause a switch of a GaN tuning device to remain or be transitioned to its closed condition. Alternatively, the order of the bit sequence in relation to the order of switches is not limited to this example.

Figure 8:
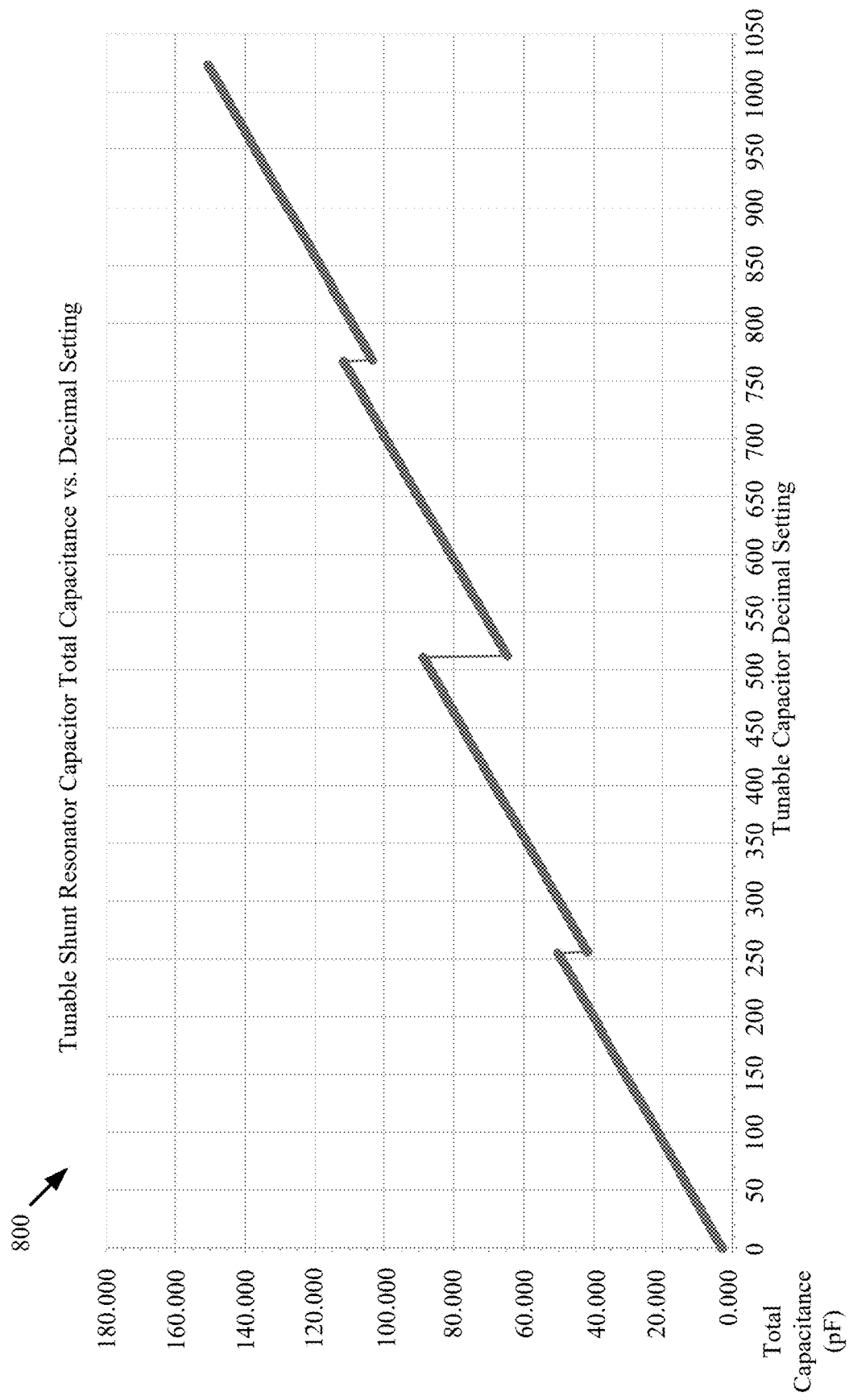
FIG. 8 provides a graph plotting a tunable shunt resonator capacitor's capacitance vs. decimal setting.
Figure 9:
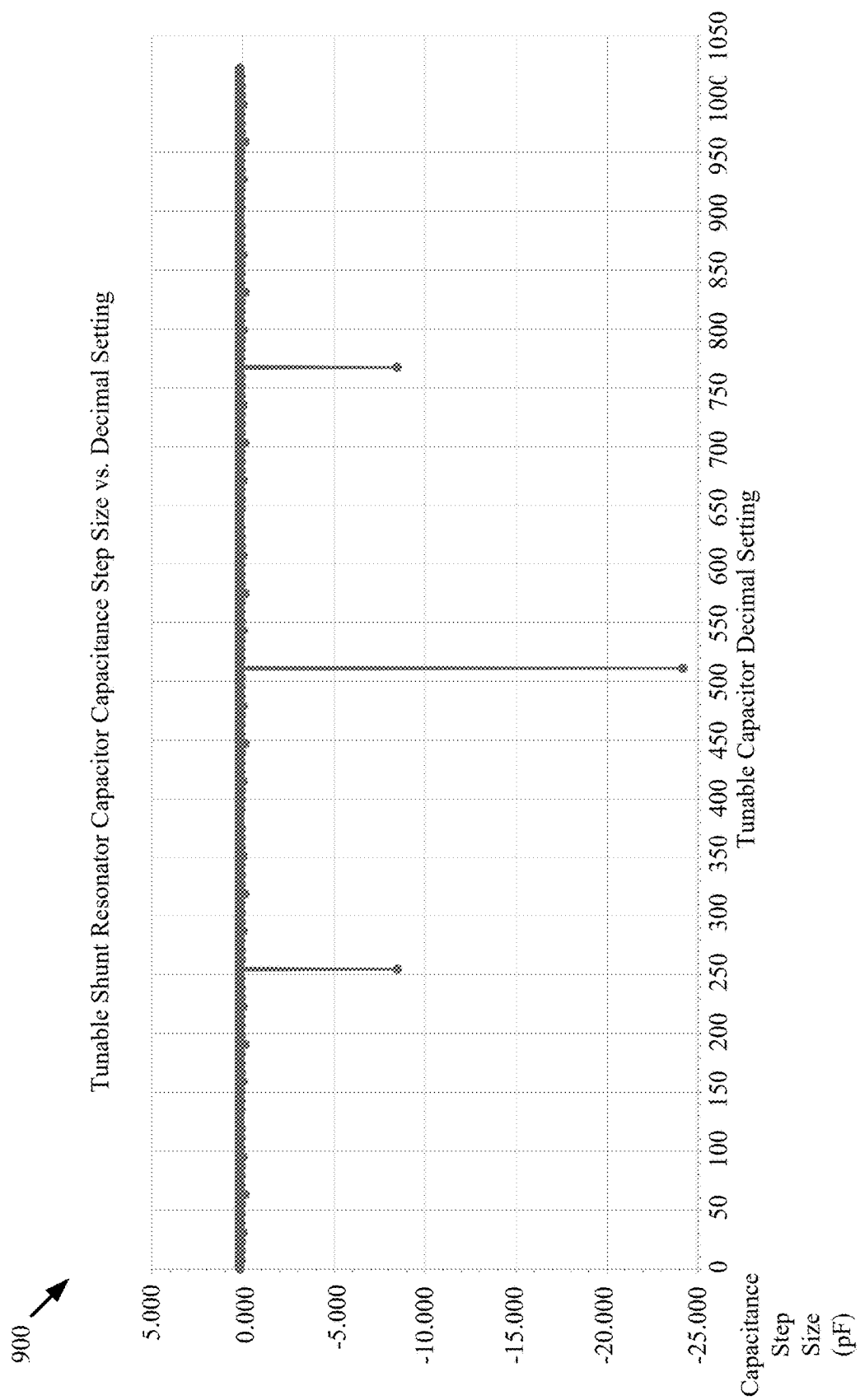
FIG. 9 provides a graph plotting a tunable shunt resonator capacitor's capacitance step size vs. decimal setting.
Figure 10:
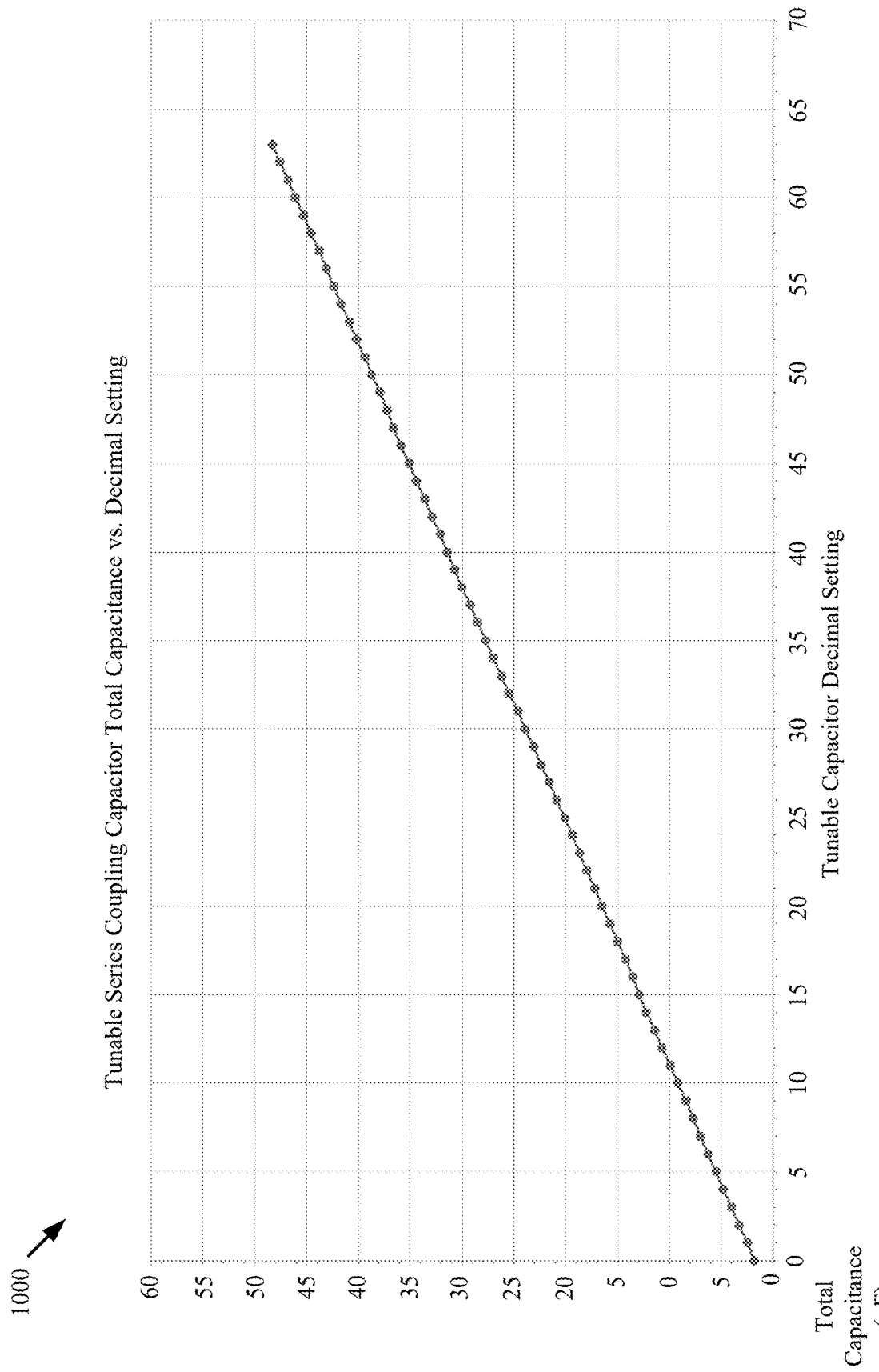
FIG. 10 provides a graph plotting a tunable series coupling capacitor's capacitance vs. decimal setting.
Figure 11:
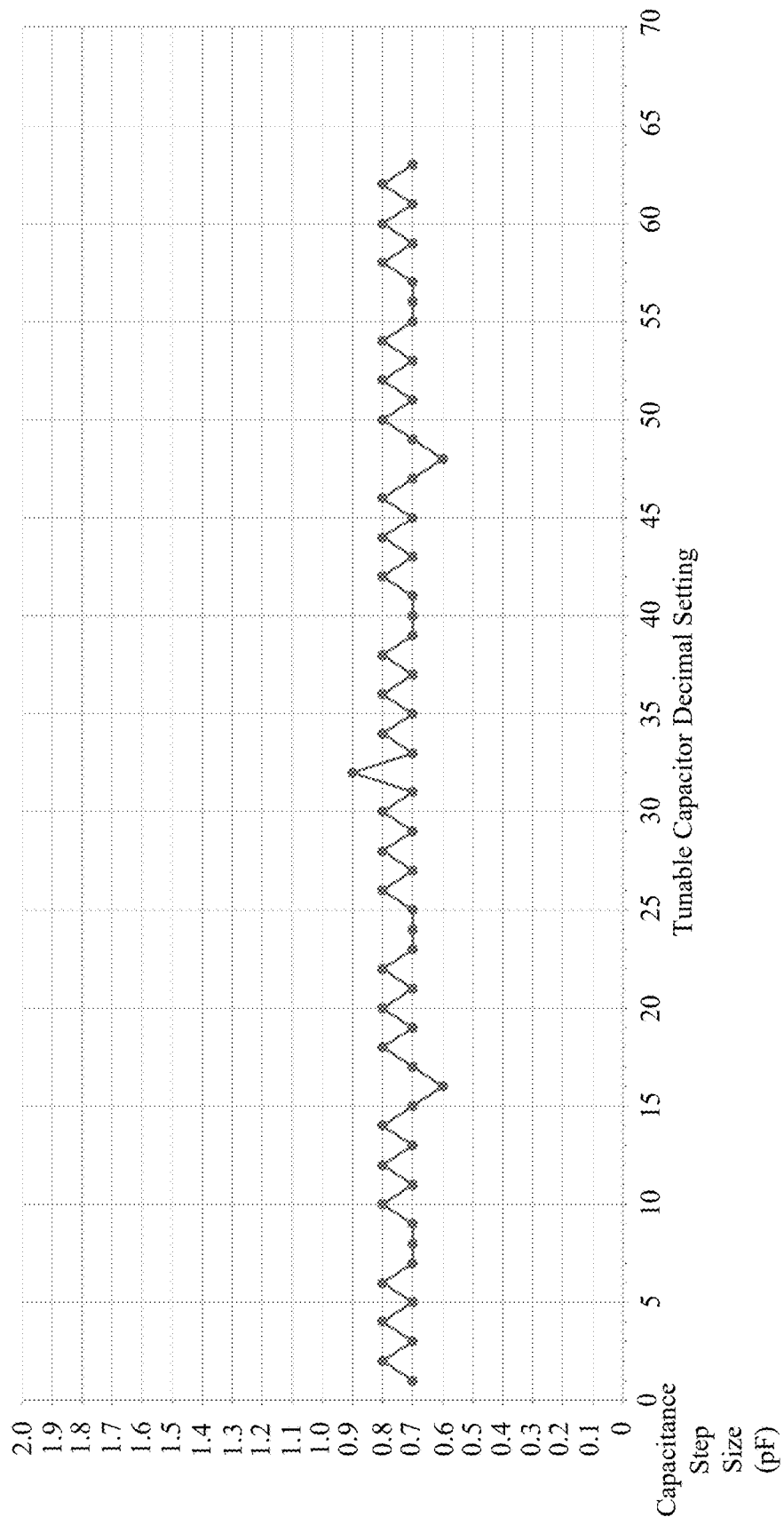
FIG. 11 provides a graph plotting a tunable series coupling capacitor's capacitance step size vs. decimal setting.
Figure 12:
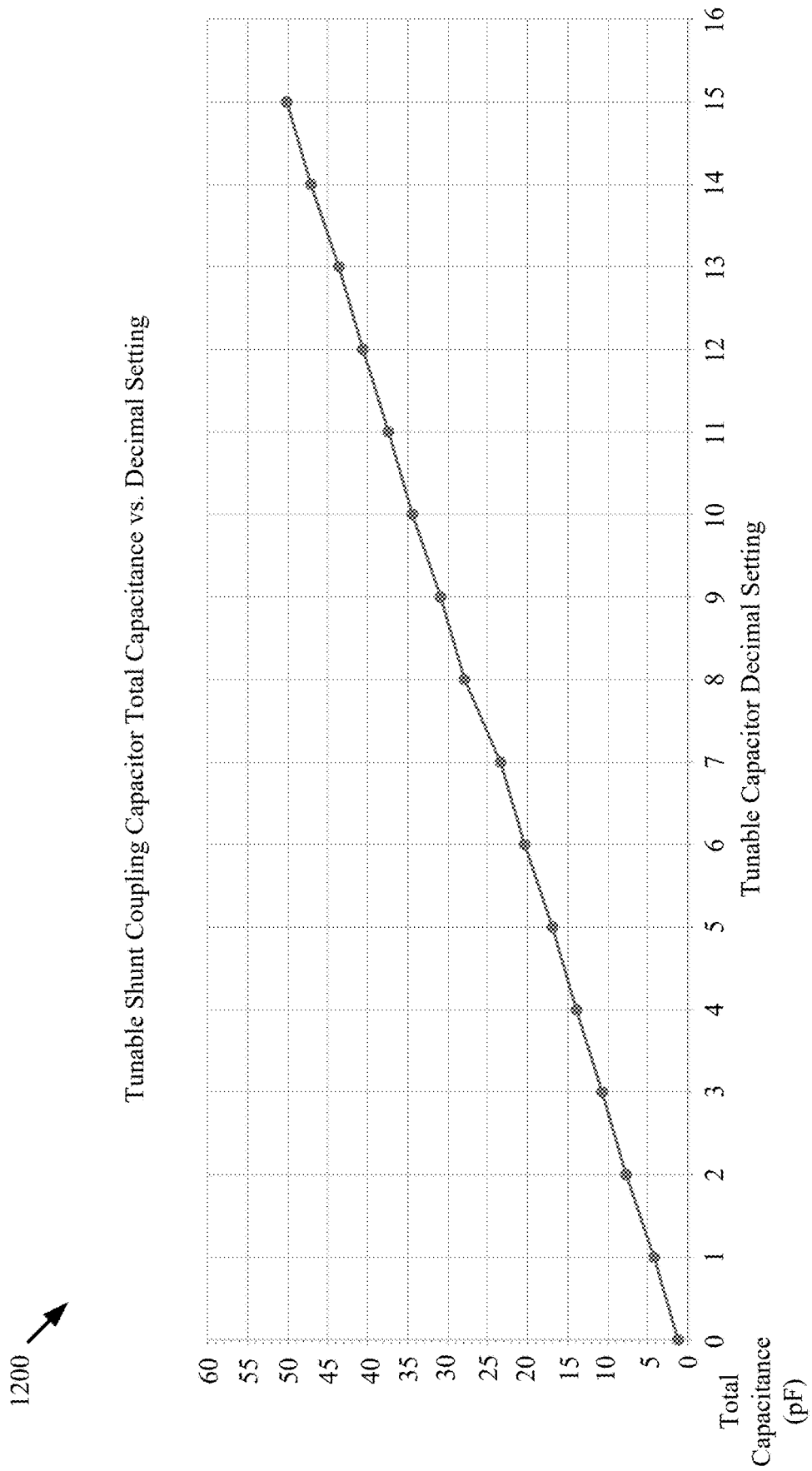
FIG. 12 provides a graph plotting a tunable shunt coupling capacitor's capacitance vs. decimal setting.
Figure 13:
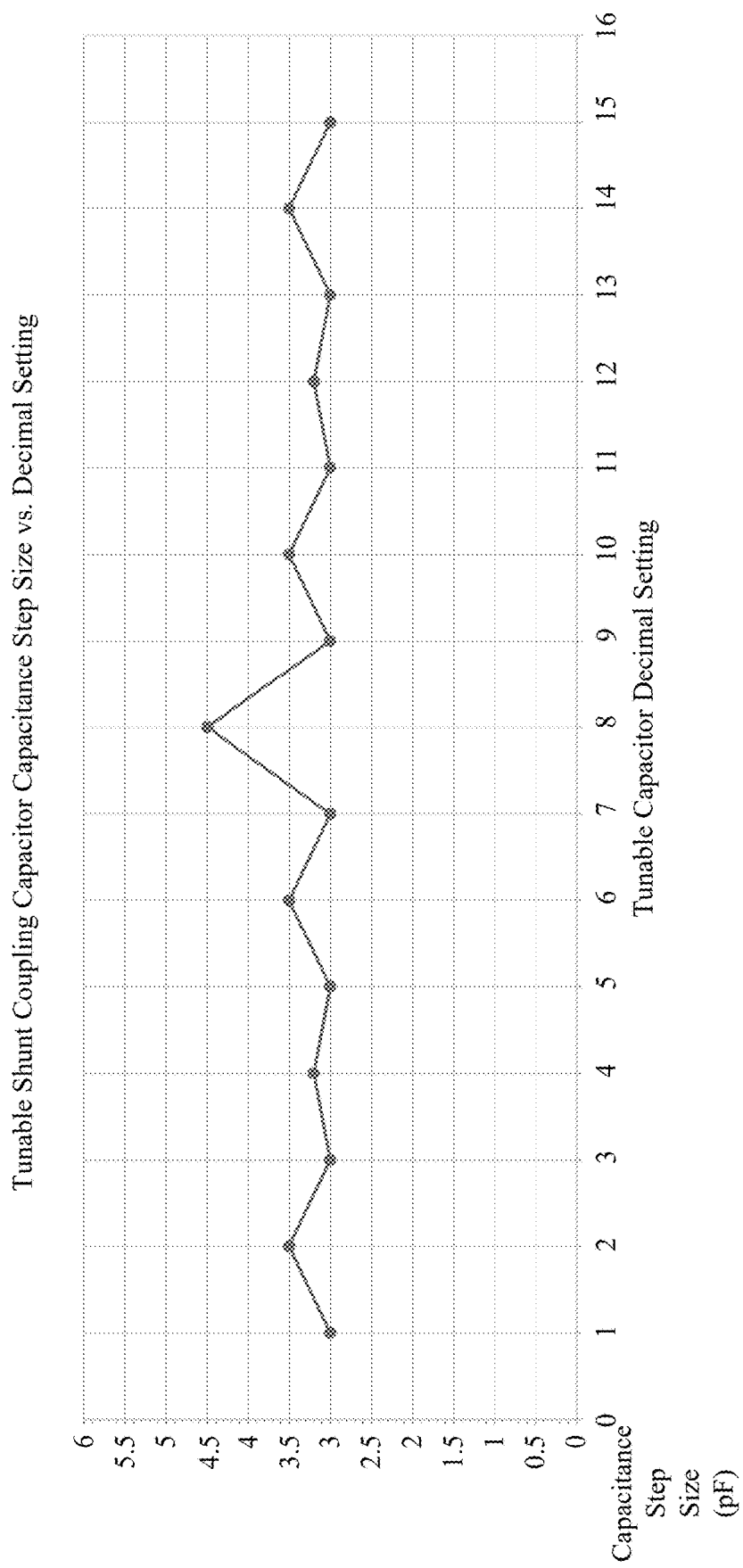
FIG. 13 provides a graph plotting a tunable shunt coupling capacitor's capacitance step size vs. decimal setting.
Figure 14:
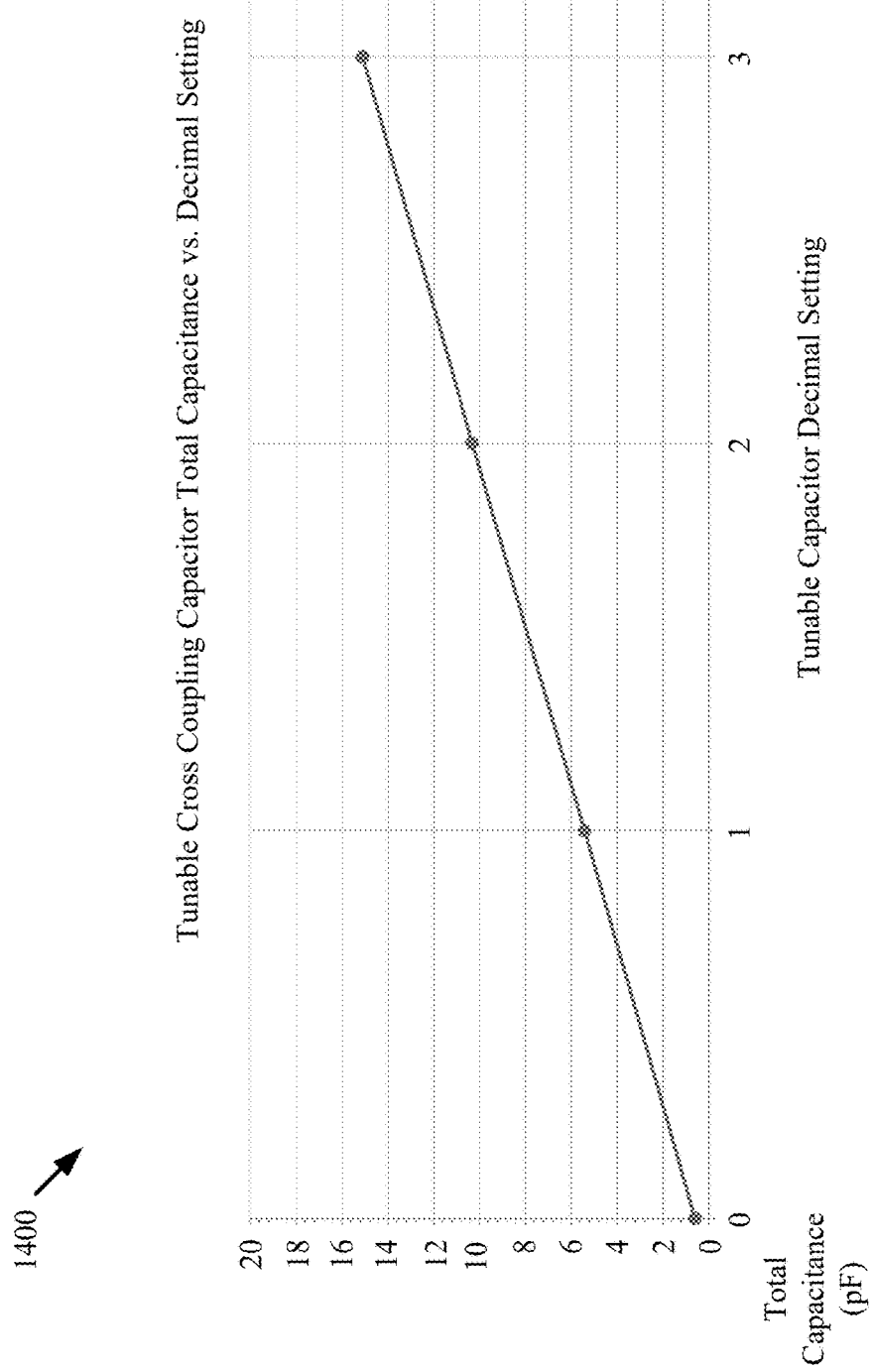
FIG. 14 provides a graph plotting a tunable cross coupling capacitor's capacitance vs. decimal setting.
Figure 15:
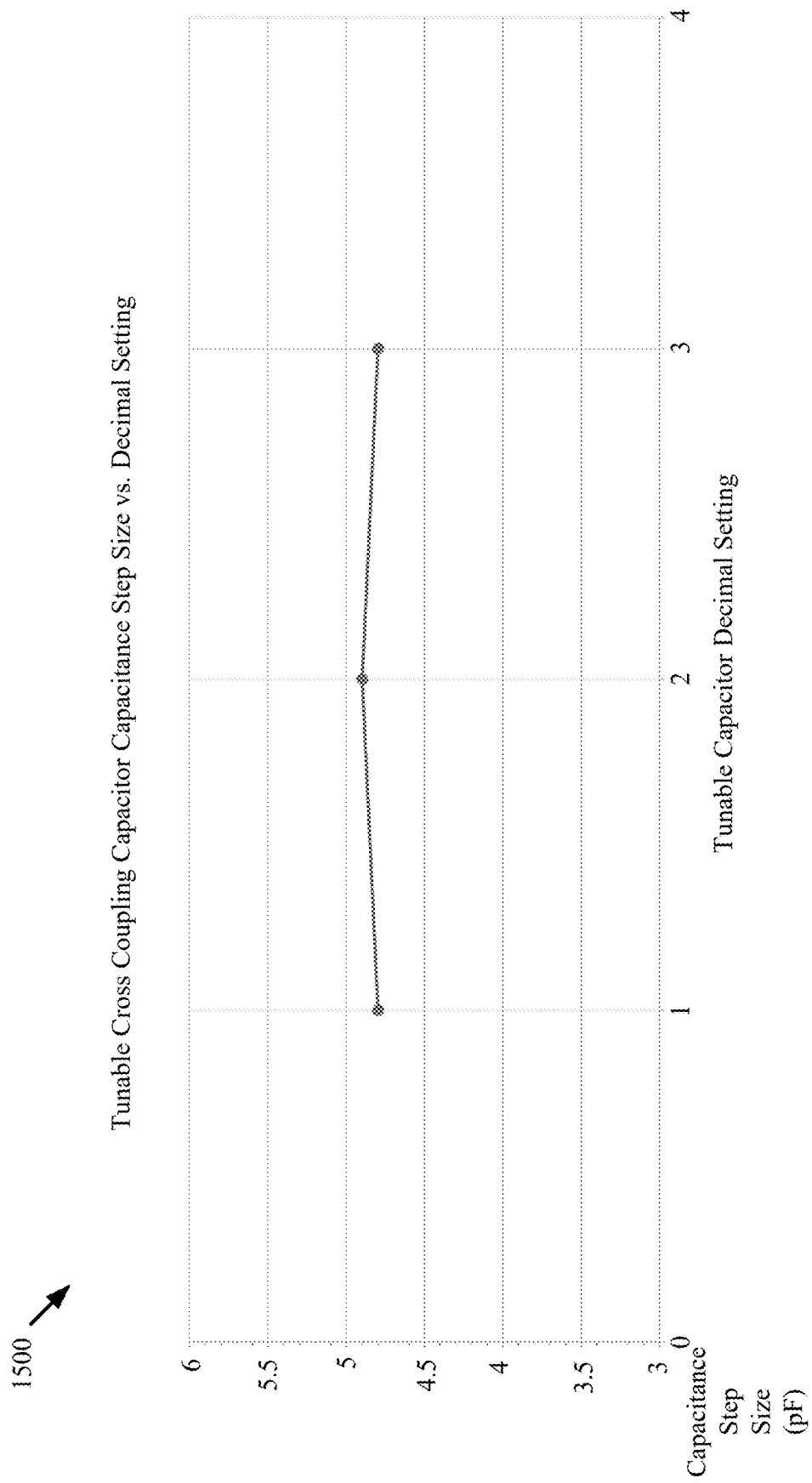
FIG. 15 provides a graph plotting a tunable cross coupling capacitor's capacitance step size vs. decimal setting.

A graph 800 is provided in FIG. 8 showing the relationship between a tunable shunt resonator capacitor's capacitance and decimal settings. A graph 900 is provided in FIG. 9 showing the relationship between a tunable shunt resonator capacitor's capacitance step size and decimal settings. A graph 1000 is provided in FIG. 10 showing the relationship between a tunable series coupling capacitor's capacitance and decimal settings. A graph 1100 is provided in FIG. 11 showing the relationship between a tunable series coupling capacitor's capacitance step size and decimal settings. A graph 1200 is provided in FIG. 12 showing the relationship between a tunable shunt coupling capacitor's capacitance and decimal settings. A graph 1300 is provided in FIG. 13 showing the relationship between a tunable shunt coupling capacitor's capacitance step size and decimal settings. A graph 1400 is provided in FIG. 14 showing the relationship between a tunable cross coupling capacitor's capacitance and decimal settings. A graph 1500 is provided in FIG. 15 showing the relationship between a tunable cross coupling capacitor's capacitance step size and decimal settings. It should be noted that the steps in the plot may improve the insertion loss of the filter by avoiding certain bit combination scenarios associated with only having the top 2 MSBs enabled.

Figure 16:
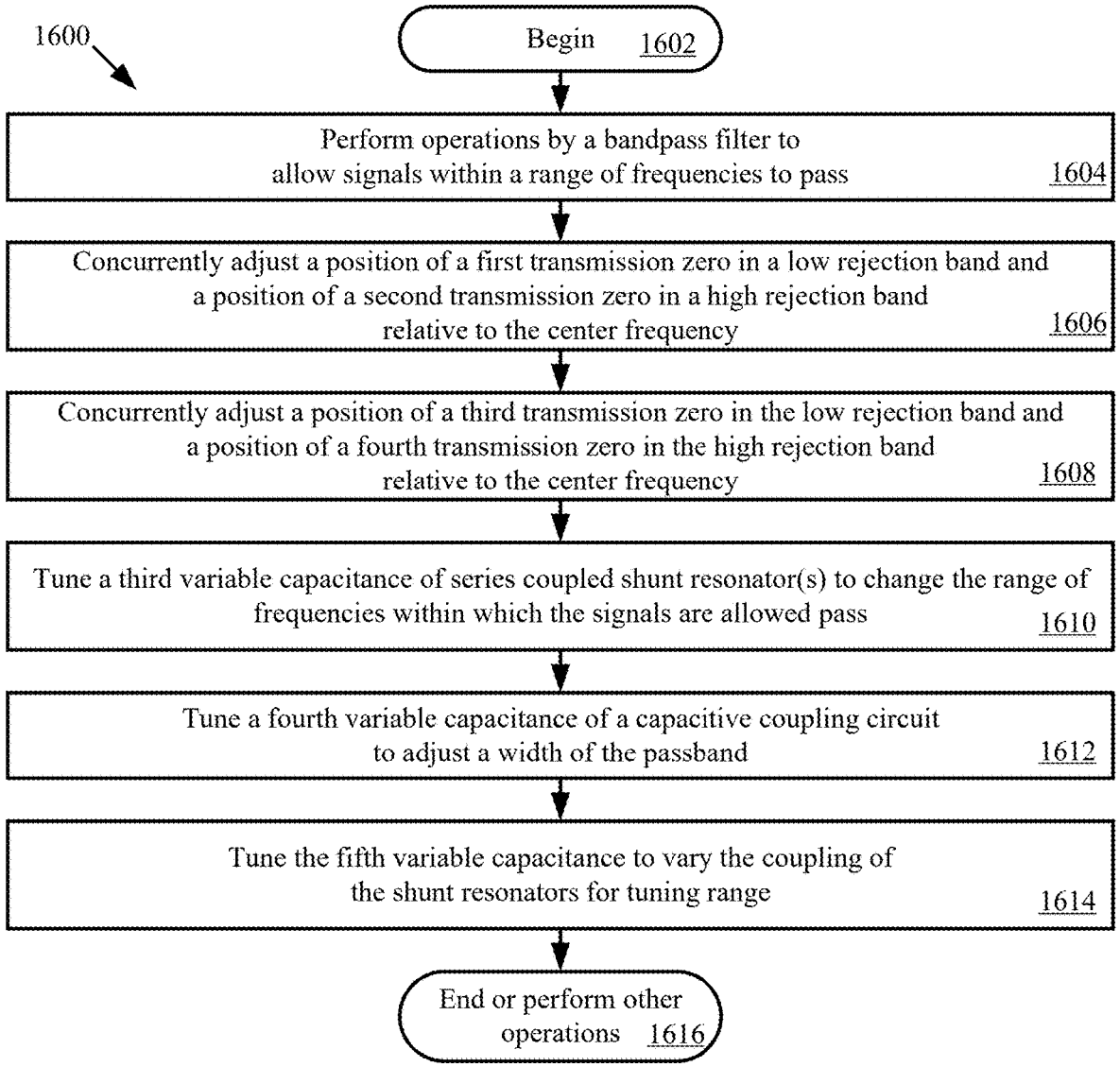
FIG. 16 provides a flow diagram of an illustrative method for operating a bandpass filter.

Referring to FIG. 16, there is provided a flow diagram of a method 1600 for operating a bandpass filter (e.g., bandpass filter 100 of FIGS. 1-3). Method 1600 begins with 1604 where the bandpass filter performs operations to allow signals within a range of frequencies to pass.

Next in block 1606, operations are performed to concurrently adjust a position of a first transmission zero (e.g., transmission zero $z_2$ of FIG. 4) in a low rejection band (e.g., low rejection band 410 of FIG. 4) and a position of a second transmission zero (e.g., transmission zero $z_3$ of FIG. 4) in a high rejection band (e.g., high rejection band 412 of FIG. 4) relative to the center frequency (e.g., center frequency $f_0$ of FIG. 4). These operations may involve tuning a first variable capacitance of a first cross-coupling circuit (e.g., cross-coupling circuit $104_1$ of FIGS. 1-2). The first variable capacitance can be tuned by controlling at least one switch (e.g., switch 201 of FIG. 2B) of a first GaN tuning device (e.g., GaN tuning device $200_1$ of FIG. 2B) to change its position to a closed condition position or an open condition position. The first cross-coupling circuit is connected to a first end of a filter line (e.g., filter line 150 of FIGS. 1-3) extending between of the first port (e.g., port 140 of FIGS. 1-3), and is connected to a center (e.g., center 130 of FIGS. 1-3) of the filter line located between a first pair of series coupled resonators (e.g., resonator pair 280 of FIG. 2B) and a second pair of series coupled resonators (e.g., resonator pair 282 of FIG. 2C).

Operations are also performed in block 1608 to concurrently adjust a position of a third transmission zero (e.g., transmission zero $z_1$ of FIG. 4) in the low rejection band and a position of a fourth transmission zero (e.g., transmission zero $z_4$ of FIG. 4) in the high rejection band relative to the center frequency. These operations may involve tuning a second variable capacitance of a second cross-coupling circuit (e.g., cross-coupling circuit $104_2$ of FIGS. 1-2). The second variable capacitance can be tuned by controlling at least one switch (e.g., switch 265 of FIG. 2C) of a second GaN tuning device (e.g., GaN tuning device $200_{18}$ of FIG. 2C) to change its position to a closed condition position or an open condition position. The second cross-coupling circuit is connected to the second end of the filter line and is connected to the center of the filter line between the first and second pairs of series coupled resonators.

In block 1610, operations are performed to tune a third variable capacitance of series coupled shunt resonator(s) (e.g., resonators $108_1$, $108_2$, $108_3$ and/or $108_4$ of FIGS. 1-2) to change the range of frequencies within which the signals are allowed pass. The third variable capacitance can be tuned by controlling at least one switch (e.g., switch 1, 2, 3 and/or 4 of FIG. 2B) of a third GaN tuning device (e.g., GaN tuning device $200_3$, $200_4$, $200_5$, $200_6$, $200_7$, $200_{13}$, $200_{14}$, $200_{15}$, $200_{16}$ and/or $200_{17}$ of FIG. 2) to change a position to a closed condition position or an open condition position.

In block 1612, operations are performed to tune a fourth variable capacitance of a capacitive coupling circuit to adjust a width of the passband and coupling between resonators $108_2$ and $108_3$. The fourth capacitance may be tuned by controlling at least one switch (e.g., switch 215 of FIG. 2B and/or 251 of FIG. 2C) of a fourth GaN tuning device (e.g., GaN tuning device $200_8$ of FIG. 2B and/or $200_{10}$ of FIG. 2C) to change a position to a closed condition position or an open condition position. The switch may be connected between (i) the first cross-coupling circuit (e.g., cross coupling circuit $104_1$ of FIGS. 1-2) and a first terminal of first capacitor (e.g., capacitor 216 of FIG. 2B) of the capacitive coupling circuit or (ii) the second cross-coupling circuit (e.g., cross coupling circuit $104_2$ of FIGS. 1-2) and a first terminal of a second capacitor (e.g., capacitor 252 of FIG. 2C) of the capacitive coupling circuit. Second terminals of the first and second capacitors are connected to ground. In block 1614, a fifth variable capacitance is tuned to vary the series capacitance coupling 106 of the shunt resonators for tuning range. Subsequently, method 1600 continues with 1616 where it ends or other operations are performed (e.g., return to 1602).

In view of the forgoing, this document concerns a bandpass filter. The bandpass filter comprises: a plurality of shunt resonators coupled in series and configured to allow signals within a range of frequencies to pass; and a cross-coupling circuit connected to the plurality of shunt resonators and configured to generate a first transmission zero in a low rejection band of the bandpass filter and generate a second transmission zero in a high rejection band of the bandpass filter.

This document also concerns a bandpass filter that comprises: a plurality of series coupled shunt resonators and configured to allow signals within a range of frequencies to pass; and first and second cross-coupling circuits connected to the plurality of resonators and collectively configured to generate first and second transmission zeros in a low rejection band of the bandpass filter and generate third and fourth transmission zeros in a high rejection band of the bandpass filter.

The first cross-coupling circuit comprises a first variable capacitance tunable to concurrently adjust a position of the second transmission zero in the low rejection band relative to a center frequency of a passband of the bandpass filter and a position of the third transmission zero in the high rejection band of the bandpass filter relative to the center frequency. The second cross-coupling circuit comprises a second variable capacitance tunable to concurrently adjust a position of the first transmission zero in the low rejection band relative to the center frequency and a position of the fourth transmission zero in the high rejection band of the bandpass filter relative to the center frequency. The tuning of the first and/or second variable capacitances may comprise controlling Gallium Nitride (GaN) switch(es).

The first cross-coupling circuit is connected to a first end of a filter line extending between a first port and a second port of bandpass filter, and is connected to a center of the filter line located between a first pair of the plurality of resonators and a second pair of the plurality of resonators. The second cross-coupling circuit is connected to a second end of the filter line and is connected to the center of the filter line between the first and second pairs of the plurality of resonators.

One or more of the resonators may comprise a third variable capacitance tunable to change the range of frequencies within which the signals are allowed pass. The tuning of the third variable capacitance may comprise controlling GaN switch(es).

The bandpass filter may further comprise a capacitive coupling circuit. The capacitive coupling circuit comprises a fourth variable capacitance tunable to adjust a width of the passband and adjusting the coupling between resonator pairs. Tuning the fourth variable capacitance may comprise controlling at least one GaN switch. This GaN switch is connected between (i) the first cross-coupling circuit and a first terminal of first capacitor of the capacitive coupling circuit or (ii) the second cross-coupling circuit and a first terminal of a second capacitor of the capacitive coupling circuit, second terminals of the first and second capacitors being connected to ground. The series capacitive coupling circuit comprises a fifth variable capacitance tunable to adjust the coupling between shunt resonators for a stable passband of the frequency tuning range. Tuning the fifth variable capacitance may comprise controlling at least one GaN switch.

The present document also concerns implementing systems and methods for operating a bandpass filter. The methods comprise: performing operations by the bandpass filter to allow signals within a range of frequencies to pass; tuning a first variable capacitance of a first cross-coupling circuit to concurrently adjust a position of a first transmission zero in a low rejection band of the bandpass filter relative to a center frequency of a passband of the bandpass filter and to adjust a position of a second transmission zero in a high rejection band of the bandpass filter relative to the center frequency; and tuning a second variable capacitance of a second cross-coupling circuit to concurrently adjust a position of a third transmission zero in the low rejection band relative to the center frequency and to adjust a position of a fourth transmission zero in the high rejection band relative to the center frequency.

The tuning of the first variable capacitance comprises controlling at least one first GaN switch and/or said tuning the second variable capacitance comprises controlling at least one second GaN switch. The first cross-coupling circuit is connected to a first end of a filter line extending between of a first port and a second port of bandpass filter, and is connected to a center of the filter line located between a first pair of series coupled resonators and a second pair of series coupled resonators. The second cross-coupling circuit is connected to a second end of the filter line and is connected to the center of the filter line between the first and second pairs of series coupled resonators.

The method may also comprise: tuning a third variable capacitance of one or more of a plurality of series connected resonators to change the range of frequencies within which the signals are allowed pass; and/or tuning a fourth variable capacitance of a capacitive coupling circuit to adjust a width of the passband and adjusting the coupling between resonator pairs of the bandpass filter. The tuning the third and/or fourth variable capacitances may comprise controlling at least one GaN switch(es). This GaN switch is connected between (i) the first cross-coupling circuit and a first terminal of first capacitor of the capacitive coupling circuit or (ii) the second cross-coupling circuit and a first terminal of a second capacitor of the capacitive coupling circuit, second terminals of the first and second capacitors being connected to ground.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

I claim:

1. A bandpass filter, comprising:
   a plurality of shunt resonators coupled in series and configured to allow signals within a range of frequencies to pass; and
   a cross-coupling circuit connected to the plurality of shunt resonators and configured to generate a first transmission zero in a low rejection band of the bandpass filter and generate a second transmission zero in a high rejection band of the bandpass filter;
   wherein cross-coupling circuit comprises
      a first capacitor having a first variable capacitance tunable to concurrently adjust a position of the first transmission zero in the low rejection band relative to a center frequency of a passband of the bandpass filter and a position of the second transmission zero in the high rejection band of the bandpass filter relative to the center frequency, and a second capacitor having a non-variable capacitance limiting a distance by which the positions of the first and second transmission zeros can move away from each other.

2. The bandpass filter according to claim 1, wherein a tuning of the first variable capacitance comprises controlling at least one first GaN switch.

3. The bandpass filter according to claim 1, wherein the bandpass filter comprises another cross-coupling circuit comprising a second variable capacitance tunable to concurrently adjust a position of another transmission zero in the low rejection band relative to the center frequency and a position of another transmission zero in the high rejection band of the bandpass filter relative to the center frequency.

4. The bandpass filter according to claim 3, wherein a tuning of the second variable capacitance comprises controlling at least one second GaN switch.

5. The bandpass filter according to claim 1, wherein the cross-coupling circuit is connected to a first end of a filter line extending between of a first port and a second port of bandpass filter, and is connected to a center of the filter line located between a first pair of the plurality of shunt resonators and a second pair of the plurality of shunt resonators.

6. The bandpass filter according to claim 5, wherein another cross-coupling circuit is connected to a second end of the filter line and is connected to the center of the filter line between the first and second pairs of the plurality of shunt resonators.

7. The bandpass filter according to claim 1, wherein one or more of the plurality of shunt resonators comprises a third variable capacitance tunable to change the range of frequencies within which the signals are allowed pass.

8. The bandpass filter according to claim 7, wherein a tuning of the third variable capacitance comprises controlling at least one GaN switch.

9. The bandpass filter according to claim 1, further comprising a capacitive coupling circuit comprising at least a third capacitor connected between a switch and ground, the switch configured to selectively switch the third capacitor into and out of the capacitive coupling circuit to facilitate an adjustment of a width of the passband and/or the coupling between two halves of the bandpass filter.

10. The bandpass filter according to claim 9, wherein the switch comprises at least one GaN switch.

11. The bandpass filter according to claim 10, wherein the at least one GaN switch is connected between (i) the cross-coupling circuit and a first terminal of the third capacitor of the capacitive coupling circuit or (ii) another cross-coupling circuit and a first terminal of a fourth capacitor of the capacitive coupling circuit.

12. A method for operating a bandpass filter, comprising:
performing operations by the bandpass filter to allow signals within a range of frequencies to pass;
tuning a first variable capacitance of a first cross-coupling circuit to concurrently adjust a position of a first transmission zero in a low rejection band of the bandpass filter relative to a center frequency of a passband of the bandpass filter and to adjust a position of a second transmission zero in a high rejection band of the bandpass filter relative to the center frequency;
tuning a second variable capacitance of a second cross-coupling circuit to concurrently adjust a position of a third transmission zero in the low rejection band relative to the center frequency and to adjust a position of a fourth transmission zero in the high rejection band relative to the center frequency; and
using a capacitor having a non-variable capacitance to limit a distance by which the positions of the first and second transmission zeros can move away from each other.

13. The method according to claim 12, wherein said tuning of the first variable capacitance comprises controlling at least one first GaN switch and/or said tuning the second variable capacitance comprises controlling at least one second GaN switch.

14. The method according to claim 12, wherein the first cross-coupling circuit is connected to a first end of a filter line extending between of a first port and a second port of bandpass filter, and is connected to a center of the filter line located between a first pair of series coupled shunt resonators and a second pair of series coupled shunt resonators.

15. The method according to claim 14, wherein the second cross-coupling circuit is connected to a second end of the filter line and is connected to the center of the filter line between the first and second pairs of series coupled resonators.

16. The method according to claim 12, further comprising tuning a third variable capacitance of one or more of a plurality of series connected resonators to change the range of frequencies within which the signals are allowed pass.

17. The method according to claim 12, further comprising tuning a fourth variable capacitance of a capacitive coupling circuit to adjust a width of the passband and/or a coupling between two halves of the bandpass filter.

18. The method according to claim 17, wherein said tuning the fourth variable capacitance comprises controlling at least one GaN switch.

19. The method according to claim 18, wherein the at least one GaN switch is connected between (i) the first cross-coupling circuit and a first terminal of first capacitor of the capacitive coupling circuit or (ii) the second cross-coupling circuit and a first terminal of a second capacitor of the capacitive coupling circuit, second terminals of the first and second capacitors being connected to ground.

* * * * *